017# United States Patent [19]

Shimizu et al.

[11] 4,366,568
[45] Dec. 28, 1982

[54] SEMICONDUCTOR LASER

[75] Inventors: Hirokazu Shimizu, Toyonaka; Kunio Itoh, Uji; Takashi Sugino; Masaru Wada, both of Takatsuki, all of Japan

[73] Assignee: Matsushita Electric Industrial Co. Ltd., Kadoma, Japan

[21] Appl. No.: 217,652

[22] Filed: Dec. 18, 1980

[30] Foreign Application Priority Data

Dec. 20, 1979 [JP] Japan .................................. 54-166508
May 19, 1980 [JP] Japan .................................. 55-66774

[51] Int. Cl.³ .............................................. H01S 3/19
[52] U.S. Cl. ........................................ 372/45; 357/17;
372/46
[58] Field of Search ....................... 372/45, 46; 357/17

[56] References Cited

U.S. PATENT DOCUMENTS 4,121,179 10/1978 Chinone et al. ...................... 372/45
4,309,670 1/1982 Burnham et al. ..................... 372/46

Primary Examiner—James W. Davie
Attorney, Agent, or Firm—Cushman, Darby & Cushman

[57] ABSTRACT

In a semiconductor laser, an n-type first clad layer, an undoped active layer, and a p-type second clad layer are formed on an n-type semiconductor substrate by liquid phase sequential epitaxial growth. The second clad layer is photo-etched to form a stripe-shaped thicker part at the center and thinner parts on both sides thereof. Thereafter, an n-type isolation layer is further epitaxially formed, and a Zn impurity is diffused in a thinner part of the isolation layer in a stripe-shaped pattern at the position above the thicker part, thereby forming a p+-type conduction region in the central part of the thinner part of the n-type isolation layer. By forming the stripe-shaped ridge part in the clad layer, light lased in the active layer is effectively confined in a stripe-shaped part thereof which is underneath the ridge part. Therefore, a stable transverse mode of lasing results. By forming the thicker part, the n-type isolation layer, very closely above the thinner side parts of the active layer, injected current is effectively confined to the lasing region which is underneath the ridge part. Therefore, the threshold current is decreased.

7 Claims, 12 Drawing Figures

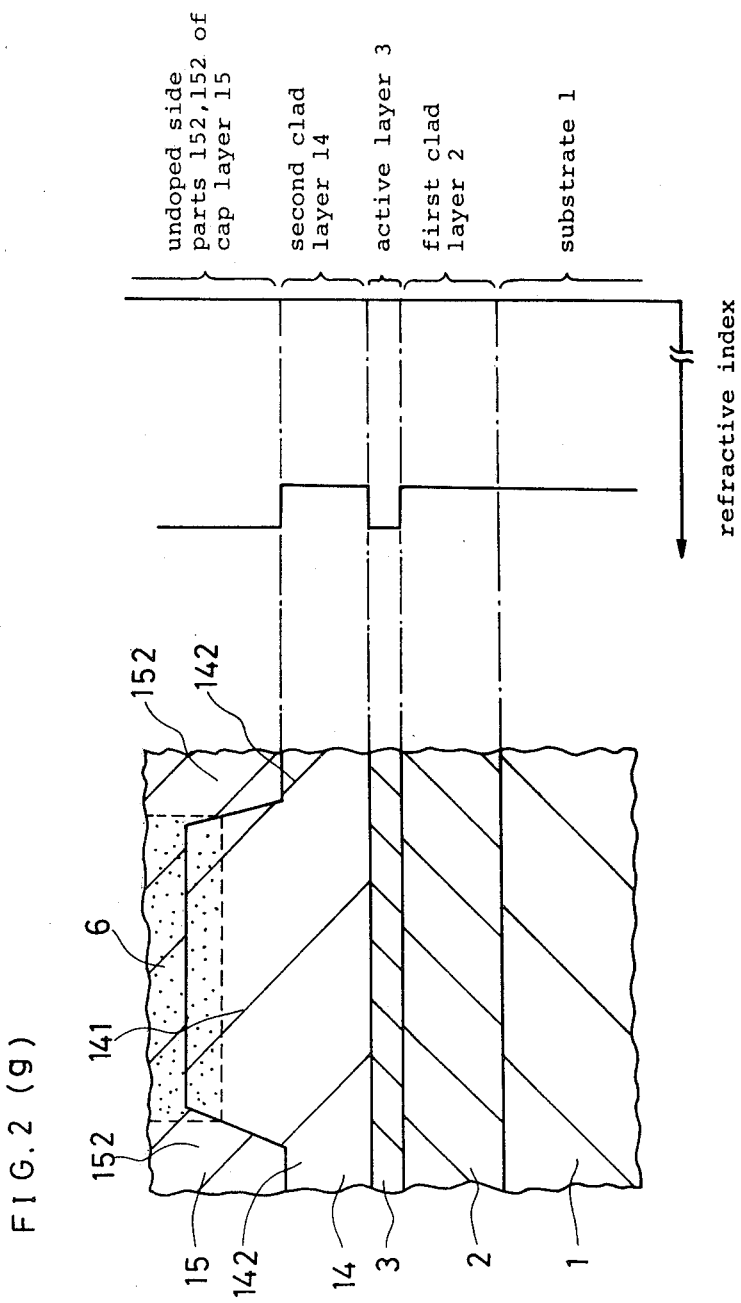

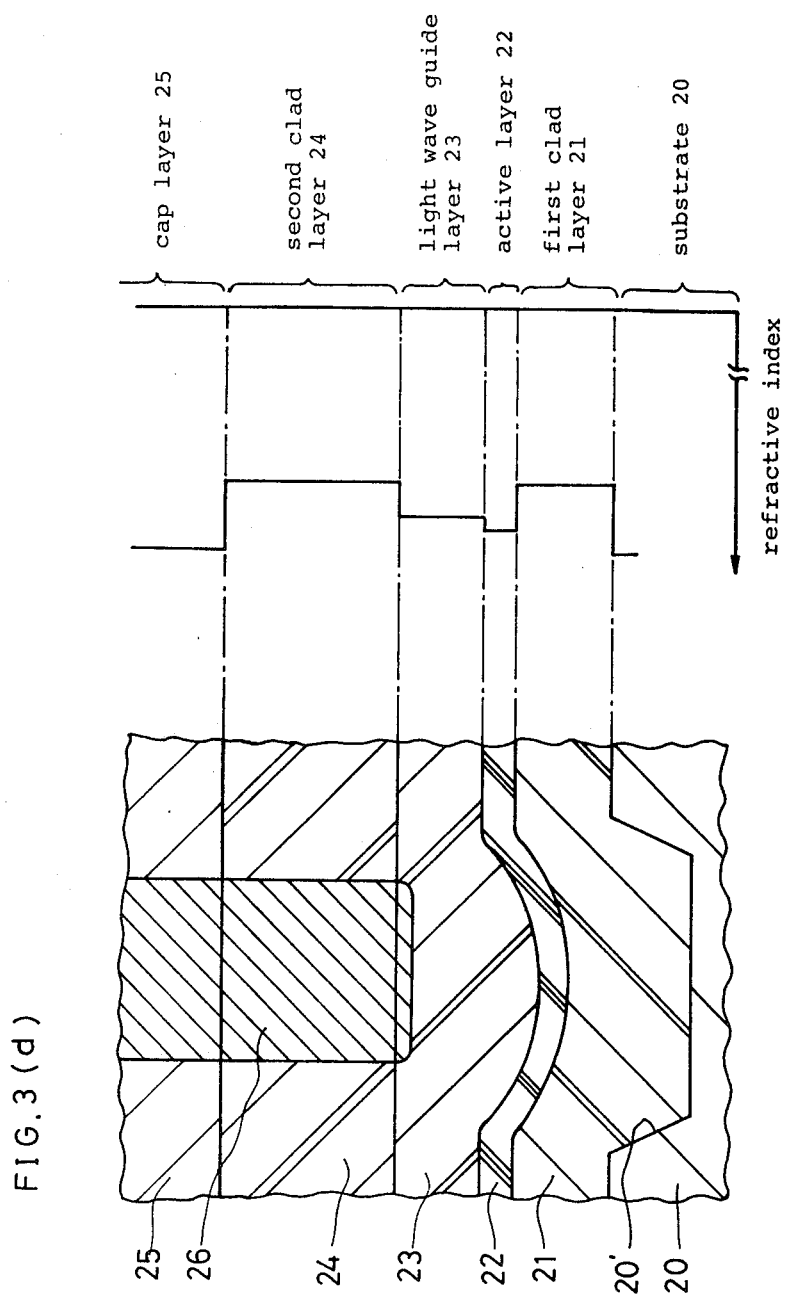

SEMICONDUCTOR LASER

BACKGROUND OF THE INVENTION

1. Field of the Invention

The present invention relates to an improvement in a semiconductor laser. The improvement is for obtaining lasers with a low threshold current and stable transverse mode lasing.

2. Description of the Prior Art

Semiconductor lasers have many advantages such as smallness, high efficiency, direct modulation by its driving current, and etc., and therefore have bright future as light sources for optical communication and optical data processing. Laser for such use necessitates characteristics of stable fundamental transverse mode lasing, low threshold current, high output of light and high reliability.

A representative example of the conventional semiconductor laser of InGaAsP/InP double heterostructure planar type is shown in FIG. 1, which is a sectional elevation view by a plane perpendicular to output light thereof. The conventional laser of FIG. 1 is made by sequential liquid phase epitaxial growth wherein on a substrate 1 of: n-InP, the following layers are sequentially formed:

a first clad layer 2 of: n-InP, an active layer 3 of: $In_{0.28}Ga_{0.72}As_{0.62}P_{0.38}$, a second clad layer 4 of: p-InP, and a cap layer 5 of: n-$In_{0.28}Ga_{0.72}As_{0.62}P_{0.38}$.

Then, on the cap layer 5, a Zn-diffused stripe-shaped ohmic contact region 6 of $p^+$-type is formed.

Thereafter, Au-Zn ohmic electrode 7 and Au-Ge-Ni ohmic electrode 8 are formed.

The abovementioned conventional semiconductor laser of FIG. 1 does not comprise a particular distribution of refractive index in the direction parallel to the junction face, which is between the layers 4 and 5, and therefore, as the injected current increases its transverse mode becomes instable, thereby inducing practically undesirable phenomena of higher mode oscillation or kink in the current—light output characteristic curve. Besides, threshold current of the abovementioned conventional laser is large since the injected current is liable to spread transversely.

SUMMARY OF THE INVENTION

The present invention purposes to provide a semiconductor laser which has a smaller threshold current, stable fundamental transverse mode lasing, and accordingly reliable performance.

The laser of the present invention has a stable transverse mode and has a small far distance spot even at a high output lasing.

BRIEF DESCRIPTION OF THE DRAWINGS

FIG. 2(g) and FIG. 3(d) are charts showing distribution of refractive index of various layers shown in the enlarged abridged sectional elevation views of the examples of FIG. 2(f) and FIG. 3(c), respectively.

DESCRIPTION OF PREFERRED EMBODIMENTS

A semiconductor laser in accordance with the present invention comprises:

a semiconductor substrate and a set of epitaxial layers formed on said semiconductor substrate, said set of epitaxial layers including a first layer formed on said substrate, an active layer formed on said first layer, a second layer, which is formed on said active layer and has a stripe shaped thicker part and thinner parts on both sides of said thicker parts, and a third layer formed on said second layer and having the same conductivity as that of said second layer at the part contacting said thicker part and the opposite conductivity to that of said second layer at the part contacting said thinner part.

Figure 1:
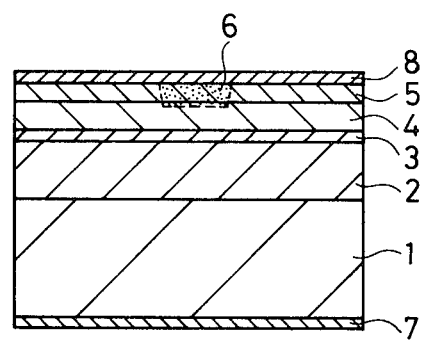
FIG. 1 is a sectional elevation view of the conventional semiconductor laser of double heterostructure planar type.
Figure 2A:
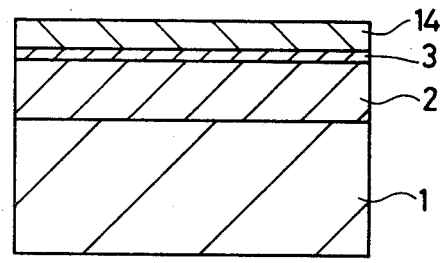
FIG. 2(a) to FIG. 2(f) are sectional elevation views showing a flow of manufacturing steps of an example embodying the present invention.

Hereafter the invention is elucidated referring to the accompanying drawings, FIG. 2(a) and thereafter, which show preferred embodiment of the present invention.

FIGS. 2(a) to 2(f) show flow of manufacturing steps of an example of InGaAsP/InP type double heterostructure laser.

Figure 2B:
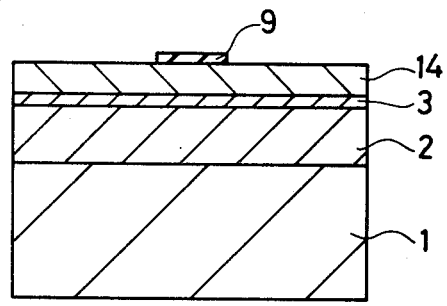
Figure 2C:
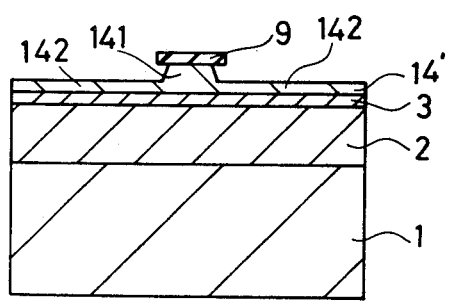
Figure 2D:
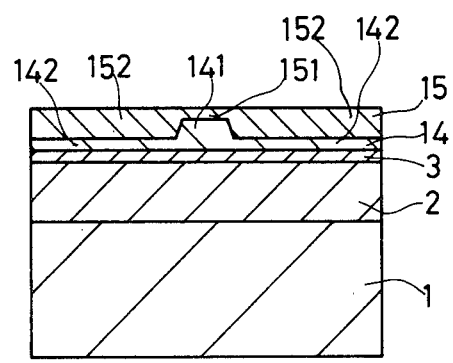
Figure 2E:
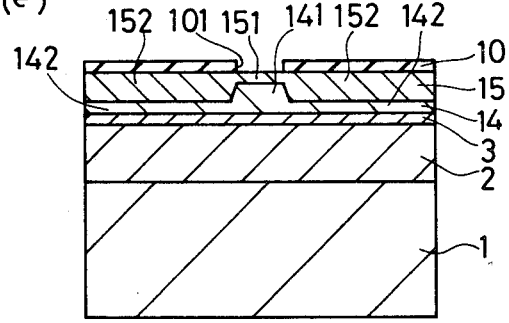
Figure 2F:
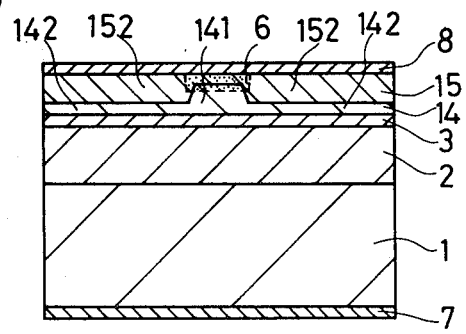

A completed laser of FIG. 2(f) is manufactured as follows: On the principal face of a substrate 1 of: n-type InP (Sn-doped, about $1 \times 10^{16}$ cm$^{-3}$ concentration), the following epitaxial layers are formed by sequential liquid phase epitaxial growth method:

a first clad layer 2 of: n-type InP (about 5 μm thick, Sn-doped, about $2 \times 10^{18}$ cm$^{-3}$ concentration), an active layer 3 of: undoped $In_{0.28}Ga_{0.72}As_{0.62}P_{0.38}$ (about 0.2 μm thick) and a second clad layer 14 of: p-type InP (about 1.5 μm thick, Cd-doped, about $5 \times 10^{17}$ cm$^{-3}$ concentration).

Then, an SiO$_2$ film of about 5000 Å thickness, which serves as an etching mask, is formed on all the face of the second clad layer 14 by sputtering, and by known photolithographic technic, the SiO$_2$ film is etched to retain only a stripe-shaped mask part 9 which is 7 μm wide and extending in <110> direction at the central part of the wafer as shown in FIG. 2(b).

Then, by utilizing the SiO$_2$ mask 9 as an etching mask, the p-type InP layer 14, which is immediately on the active layer 3, is etched in a manner that the thickness in the thinner parts 142, 142 is thinned to about 0.3 μm as shown in FIG. 2(c). Then, by removing the etching mask 9, a ridge, i.e., thicker part 141 of the stripe-shaped pattern of about 5 μm width is formed on the layer 14.

Thereafter, by another epitaxial growth, a cap layer 15 of: n-type InGaAsP (Sn-doped to have concentration of $1 \times 10^{18}$ cm$^{-3}$)

is formed on the p-type InP layer 14, in a manner to have a thickness 1.5 μm at both thicker side parts 152, 152 as shown by FIG. 2(d). Thus the cap layer 15 is formed with the thicker part 141 projecting thereinto. The cap layer 15 should have a larger refractive index than that of the underlying second layer 14. This can be done by controlling the fractions of In and P.

Then, an SiO$_2$ film 10 of about 500 μm thickness is formed by sputtering, and subsequently a stripe-shaped opening 101 of about 5 μm width is made by a known photo-etching method on the SiO₂ film 10 as shown by FIG. 2(e). Through the opening 101, Zn as acceptor is diffused on the upper part of the cap layer 15, so as to change the stripe-shaped part 151 under the opening 101 of the cap layer 15 onto a p$^+$-type contact region 6, retaining both side parts (i.e., thicker part of the cap layer 15) 152, 152 in n-type. The diffusion is made in a manner that the diffusion front of the p$^+$-type contact region 6 reaches the underlying ridge part 141 of the p-type layer 14, thereby to form a stripe-shaped contact region 6 contacting the ridge part 141.

After removing the SiO₂ film 10, the substrate 1 is chemically etched in a manner that overall thickness of the wafer becomes about 100 μm. Then, an n-side ohmic electrode 7 is formed by vapor deposition of Au-Ge-Ni alloy on the bottom surface of the substrate 1, and a p-side ohmic electrode 8 is formed by a vapor deposition of AuZn alloy on the surface of the cap layer 15, and a sintering at the temperature of 430° C. is made and the wafer is cut into individual laser chips having a resonator length of, about 250 μm to complete the device of FIG. 2(f). The device is then bonded on a heat sink of for example cupper (not shown).

The laser produced in the abovementioned process has thinned side parts 142, 142 ohmically contacting the active layer 3 by its lower face and forming a current limiting p-n junction with the n-type side parts 152, 152 of the cap layer 15 at its upper face. Therefore, the current limiting p-n junction is formed very close to the active layer 3, forming thereon a stripe-shaped current injecting opening at the position of the ridge part 141. Accordingly, the current injected to the active layer 3 is well confined to the narrow stripe-shaped part, in comparison with conventional lasers of planar stripe type or oxide stripe type. Therefore the threshold current of the lasers in accordance with the present invention is small.

The active layer 3 is made to have a higher refractive index that that of the clad layers 2 and 14 as shown by FIG. 2(g), and both clad layers are thick enough to confine the laser light in the central part of the active layer. Therefore, the laser light is well confined laterally in the active layer 3.

Furthermore, by means of ridge structure of the layer 14 which is neighboring the active region 3, the light lased in the central part of the active layer 3, which central part is under the thicker ridge part 141 of the layer 14, is hardly absorbed since the clad layer 141 is thick and the overlying cap layer 15 which serves as a light absorbing layer is thin at the center part, while the light of higher mode in side parts of the active layer 3, which side parts are under the thinner parts 142, 142 of the layer 14, is easily absorbed through the thin parts 142, 142 by the thicker parts 152, 152 of the cap layer 15 which has a light absorbing nature. Accordingly, the lased light is well confined transversely in the central part of the active layer 3.

For example, in optical communication, lights of a relatively long wavelength of 1.3 μm to 1.7 μm are preferable since for such wavelength the optical fibres show the lowest loss. According to the present invention, by selecting the thickness of the thicker part (ridge part) 141 of the layer to be 1.3 μm to 1.5 μm, fundamental mode of lasing of such light having relatively long wavelength can be confined in the part of the active layer which is under ridge part 141. The width of the ridge part 141 which define the active region in the active layer 3 is about 5 μm, and this width is sufficient for confining fundamental transverse mode. The data of the laser of the example of FIG. 2(f) are:

light wavelength is: 1.3 μm
threshold current at the room temperature: 80 mA
CW output of fundamental transverse mode at one output plane: 10 mW up.

The semiconductor laser in accordance with the present invention uses a flat substrate as a starting substrate of the epitaxial growth for the double heterostructure, and therefore, the manufacturing is relatively easy, and there is a superior advantage that the first clad layer 2 can be formed sufficiently thick thereby obtaining high quality of crystal structures in the epitaxial layers.

Figure 3A:
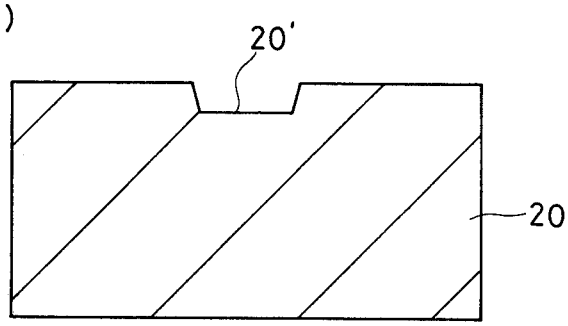
FIG. 3(a) to FIG. 3(c) are sectional elevation views showing a flow of manufacturing steps of another example embodying the present invention.
Figure 3B:
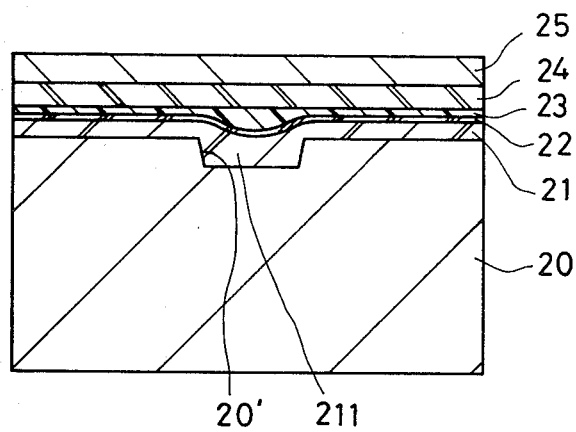
Figure 3C:
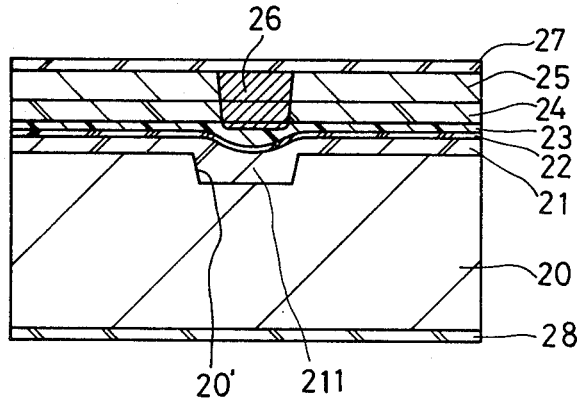

FIG. 3(a) to FIG. 3(c) show flow of manufacturing steps of a second example of GaAlAs/GaAs type double heterostructure laser characterized by a use of a substrate 20 having a stripe-shaped groove 20' on its principal face.

A completed laser of FIG. 3(c) is manufactured as follows: On the principal face of
a substrate 20 of: n-type GaAs
(having a stripe shaped groove 20' of about 6 μm width and about 1 μm depth as shown by FIG. 3(a))

the following epitaxial layers are formed by sequential liquid phase epitaxial growth method:
a first clad layer 21 of: n-type Ga$_{0.65}$Al$_{0.35}$As.
(Sn-doped and 1.1 μm thick at center and 0.4 μm thick at side parts),
an active layer 22 of: undoped GaAs
(0.1 μm thick at center and at side parts),
a light wave guide layer 23 of: p-type Ga$_{0.9}$Al$_{0.1}$As
(Ge-doped and 0.3 μm thick at center and 0.1 μm thick at side parts),
a second clad layer 24 of: n-type Ga$_{0.65}$Al$_{0.35}$As
(Sn-doped and 0.7 μm thick at center and at side parts),
a cap layer 25 of: n-type GaAs
(Sn-doped and 1.0 μm thick at center and at side parts).

The abovementioned thicknesses of the layers at center are those on the vertical plane which passes at the center of the groove 20', and the thicknesses at side parts are those at the side parts which are above the parts out of the groove 20'. Such controllings of the thickness can be made easily by selecting the supercooling temperature to be 6° to 8° C. under the condition of the growth start temperature of 830° C. and cooling rate of 0.5° C./min. As a result of the epitaxial growths, the wafer shown by FIG. 3(b) is produced.

Then, an etching mask of a Si₃N₄ film with a stripe-shaped opening of 4 μm width is formed by a known photolithographic method. And Zn as acceptor is diffused in a manner that diffusion front reaches the light wave guide layer 23, thereby to form p$^+$-type current injection region 26 above the groove 20'. After removing the etching mask by a known method, and after etching the bottom face of the substrate to make the wafer 100 μm thick, a p-side electrode 27 is formed on the cap layer 25 by sequential sputtering of Ti and Pt followed by a vacuum deposition of Au; and an n-side electrode 28 is formed on the bottom face of the substrate 20 by a vapor deposition of Au-Ge-Ni alloy as shown by FIG. 3(c).

Of course, the structure and manufacture of the laser elucidated referring to FIG. 3(a) to FIG. 3(c) is equally applicable to the InP/InGaAsP type laser.

The laser produced in the abovementioned process has thinner side parts 212, 212, and thicker central part 211 of the first clad layer 21, and the active layer has an active region having a curved section. The distribution of refractive index of the component epitaxial layers is shown in FIG. 3(d). That is, the refractive index of the light wave guide layer 23 is selected higher than the clad layers 21 and 24 and is close to that of the active layer 22 by controlling Al contents of the layer. Accordingly, the light is confined in the active layer 22 and the light wave guide, thereby forming a large optical cavity (LOC) structure.

Furthermore, the structure of this example has a feature that the LOC is thickest at the center of the groove 20' and becomes thinner as a point becomes farer from the center. Therefore, the effective refractive index is largest at the central plane and becomes smaller as a point becomes farer from the center. This results in a good confinement of light also in transverse directions (i.e., left-right direction of the FIG. 3(d), and hence lasing with a stable transverse mode is realizable. Besides, by the use of the LOC structure, the light confinement in the vertical direction of the junction is gentle, and therefore, divergence angle of the output light can be made small. Therefore, the active layer 22 must not be very thin. Moreover, because of the LOC structure, the light energy distributes broadly in the sectional plane of the cavity, and therefore there is no problem that an output light of a very high density damages the output face of the cavity, and hence a large output can be taken out.

Since the confinement of light in the transverse direction is made by the LOC structure, there is no use of light absorbing regions (i.e. light loss region formed as very thin regions) on both side parts of the groove 20'. Therefore, by omission of the very thin light absorbing regions, the epitaxial growth become simple and easy. And also thereby, the width of the current injection region can be made very narrow, resulting in that, by an aid of the p-n junction between the n-type second clad layer 24 and the p-type light wave guide layer 23, the current injection path is limited sufficiently narrow to the bottom face of the stripe-shaped current injection region 26. Since the transverse divergence of the injected current is suppressed by the abovementioned reason, the external differential quantum efficiency becomes high, and also the threshold current becomes low.

The data of the laser of the example of FIG. 3(c) are:
threshold current: about 30 mA,
external differential quantum efficiency: 40% up,
maximum current for stable fundamental
transverse mode and linear current-output: 3 times of the threshold current,
divergence angle of light:
in the direction parallel to the junction: 15°
in the direction perpendicular to the junction: 30°

What is claimed is:
1. In a semiconductor laser, a structure comprising
a semiconductor substrate and a set of epitaxial layers formed on said semiconductor substrate,
wherein said set of epitaxial layers includes
a first layer formed on said substrate,
an active layer formed on said first layer,
a second layer, which is formed on said active layer and has a stripe-shaped thicker part and thinner parts on both sides of said thicker part, and
a third layer formed on said second layer and having a stripe-shaped region as a current injection region of a same conductivity type as that of said second layer only at the part contacting said thicker part, and having other regions of the opposite conductivity type to that of said second layer at the parts contacting said thinner part.

2. A semiconductor laser structure in accordance with claim 1, wherein said active layer is flat and
said stripe-shaped thicker part of said second layer projects into said third layer.

3. A semiconductor laser structure in accordance with claim 1, wherein said substrate, said first layer and said second layer are InP, and
said active layer and said third layer are InGaAsP.

4. A semiconductor laser structure in accordance with claim 1, wherein said substrate has a stripe-shaped groove and said stripe-shaped thicker part of said second layer is formed above said groove.

5. A semiconductor laser structure in accordance with claim 1 or 4, wherein said second layer forms a light wave guide.

6. A semiconductor laser structure in accordance with claim 1, wherein said third layer consists of a clad layer and a cap layer.

7. In a semiconductor laser, a structure comprising
a semiconductor substrate and a set of epitaxial layers formed on said semiconductor substrate, and including
a first layer formed on said substrate,
an active layer formed on said first layer,
a second layer formed on said active layer,
a third layer formed on said second layer,
wherein said second layer has a stripe-shaped thicker part and thinner parts on both sides of said thicker part, and
said third layer has a stripe-shaped region as a current injection region of a same conductivity type as that of said second layer only at the part contacting said thicker part, and has other regions of the opposite conductivity type to that of said second layer at the parts contacting said thinner part.

* * * * *